US011444448B2

(12) United States Patent
Li et al.

(10) Patent No.: US 11,444,448 B2
(45) Date of Patent: Sep. 13, 2022

(54) LEAKAGE CURRENT DETECTION AND PROTECTION DEVICE, AND POWER CONNECTOR AND ELECTRICAL APPLIANCE EMPLOYING THE SAME

(71) Applicant: Chengli Li, Suzhou (CN)

(72) Inventors: Chengli Li, Suzhou (CN); Long Chen, Suzhou (CN)

(73) Assignee: Chengli Li, Suzhou (CN)

( * ) Notice: Subject to any disclaimer, the term of this patent is extended or adjusted under 35 U.S.C. 154(b) by 0 days.

(21) Appl. No.: 17/314,976

(22) Filed: May 7, 2021

(65) Prior Publication Data

US 2021/0265832 A1    Aug. 26, 2021

Related U.S. Application Data

(63) Continuation-in-part of application No. 16/653,457, filed on Oct. 15, 2019, now Pat. No. 11,018,496.

(30) Foreign Application Priority Data

| Oct. 10, 2019 | (CN) | .......................... 201910957936.6 |
| Oct. 10, 2019 | (CN) | .......................... 201921690901.2 |
| Apr. 30, 2021 | (CN) | .......................... 202110481057.8 |
| Apr. 30, 2021 | (CN) | .......................... 202120930948.2 |

(51) Int. Cl.
*H02H 3/00* (2006.01)
*H02H 3/16* (2006.01)
*G01R 31/58* (2020.01)
*G01R 31/52* (2020.01)
*H02H 1/00* (2006.01)

(52) U.S. Cl.
CPC ............... *H02H 3/16* (2013.01); *G01R 31/52* (2020.01); *G01R 31/58* (2020.01); *H02H 1/0007* (2013.01)

(58) Field of Classification Search
None
See application file for complete search history.

(56) References Cited

U.S. PATENT DOCUMENTS

| 8,436,739 | B2 | 5/2013 | Elms et al. |
| 9,312,680 | B2 | 4/2016 | Li et al. |
| 9,906,014 | B2 | 2/2018 | Gao et al. |
| 11,018,496 | B2 * | 5/2021 | Li ............................ H02H 7/20 |

(Continued)

*Primary Examiner* — Stephen W Jackson
(74) *Attorney, Agent, or Firm* — Chen Yoshimura LLP

(57) ABSTRACT

An leakage current detection and protection device includes a leakage current detection module for detecting a leakage current on the power supply lines and generating a detection feedback signal in response thereto, a self-test module for testing whether the leakage current detection module is faulty, and a trip module for disconnecting the power supply lines in response to the self-test fault signal. The self-test module includes a simulated leakage current trigger circuit for generating a simulated leakage current trigger signal, a simulated leakage current generating circuit for generating a simulated leakage current signal in response to the simulated leakage current trigger signal, a trigger signal turn-off module for turning off the simulated leakage current trigger signal in response to the detection feedback signal, and a fault signal generating module for detecting a fault in the leakage current detection module and generating a self-test fault signal in response thereto.

15 Claims, 7 Drawing Sheets

(56) References Cited

U.S. PATENT DOCUMENTS

2008/0225448 A1\* 9/2008 Li ..................... H02H 11/002
 361/45
2016/0363627 A1\* 12/2016 Epee ..................... H02H 3/044
2018/0109102 A1 4/2018 Li et al.
2018/0149690 A1 5/2018 Li et al.

\* cited by examiner

LEAKAGE CURRENT DETECTION AND PROTECTION DEVICE, AND POWER CONNECTOR AND ELECTRICAL APPLIANCE EMPLOYING THE SAME

BACKGROUND OF THE INVENTION

Field of the Invention

This invention relates to electrical appliances, and in particular, it relates to a leakage current detection and protection device with self-test function, as well as power connector and electrical appliance employing the same.

Description of Related Art

Electrical appliances are widely used in homes and industries. To ensure safety, leakage current detection and protection devices are typically provided at the output end of the electric grid or the input end of appliances. Such devices are typically provided with prominent warning messages such as "Test before use" to advise the user to test whether the leakage current detection and protection devices are functioning properly. However, during use, because of environmental or installation factors, even when tests are done before using the leakage current detection and protection devices, some devices may still lose their protection function during use, presenting danger to the user.

For this reason, many current leakage current detection and protection devices are provided with self-test functions in addition to the leakage current detection and protection functions. Self-test circuits in conventional leakage current detection and protection devices typically use integrated circuit (IC) devices to achieve self-test; their associated circuitry is complex and costly to manufacture.

SUMMARY

Accordingly, the present invention is directed to a leakage current detection and protection device that employs only discrete components to achieve the self-test circuit, resulting in simpler structures and lower manufacturing cost.

To achieve the above objects, the present invention provides an leakage current detection and protection device for power supply lines, which includes: a leakage current detection module, configured to detect a leakage current present on the power supply lines and to generate a detection feedback signal in response to detecting the leakage current; a self-test module, configured to test whether the leakage current detection module is faulty, the self-test module including: a simulated leakage current trigger circuit, configured to generate a simulated leakage current trigger signal; a simulated leakage current generating circuit, configured to generate a simulated leakage current signal in response to the simulated leakage current trigger signal, wherein the simulated leakage current signal simulates a leakage current signal on the power supply lines; a trigger signal turn-off module, configured to turn off the simulated leakage current trigger signal in response to the detection feedback signal; and a fault signal generating module, coupled to the simulated leakage current trigger circuit, and configured to detect a fault in the leakage current detection module and to generate a self-test fault signal in response to detecting the fault; and a trip module, coupled on the power supply lines and configured to disconnect the power supply lines in response to the self-test fault signal.

In some embodiments, the simulated leakage current trigger circuit, the simulated leakage current generating circuit, the trigger signal turn-off module and the fault signal generating module include only discrete components.

In some embodiments, the simulated leakage current trigger circuit includes a trigger diode, configured to generate the simulated leakage current trigger signal when conductive; and a delay module, coupled to the trigger diode and configured to control the conductivity of the trigger diode, wherein the delay module controls a time interval of the generation of the simulated leakage current trigger signal.

In some embodiments, the delay module includes serial connected first resistor and first capacitor, and the trigger signal turn-off module includes a first semiconductor device, wherein the first semiconductor device is configured to become conductive in response to the detection feedback signal to provide a discharge path for the first capacitor to turn off the simulated leakage current trigger signal.

In some embodiments, the simulated leakage current generating circuit includes a second resistor coupled to the trigger diode, configured to form a current path for the simulated leakage current when the trigger diode is conductive.

In some embodiments, the simulated leakage current generating circuit includes a second semiconductor device, a fourth resistor and a fifth resistor, wherein a first electrode of the second semiconductor device is coupled to the fourth resistor, and a control electrode of the second semiconductor device is coupled to the trigger diode via the fifth resistor, and wherein when the trigger diode becomes conductive, the second semiconductor device becomes conductive in response thereto to form a current path for the simulated leakage current signal via the fourth resistor.

In some embodiments, the fault signal generating module includes serial connected third resistor and second capacitor, wherein in response to the simulated leakage current trigger signal, the third resistor charges the second capacitor, and wherein when the leakage current detection module is faulty and does not generate the detection feedback signal to turn off the simulated leakage current trigger signal, the fault signal generating module generates the self-test fault signal at the second capacitor.

In some embodiments, the fault signal generating module includes a third resistor, and the leakage current detection module includes a fourth capacitor coupled in series with the third resistor, wherein in response to the simulated leakage current trigger signal, the third resistor charges the fourth capacitor, and wherein when the leakage current detection module is faulty and does not generate the detection feedback signal to turn off the simulated leakage current trigger signal, the fault signal generating module generates the self-test fault signal at the fourth capacitor.

In some embodiments, each of the first and the second semiconductor device is a silicon controlled rectifier (SCR), or a bipolar junction transistor (BJT), or a field-effect transistor (FET), or a photoelectric coupling element.

In some embodiments, the trip module includes: a switch module coupled on the power supply lines between an input end and an output end, and configured to connect or disconnect an electrical connection between the input end and the output end; and a drive module, configured to drive the switch module in response to the self-test fault signal to disconnect the electrical connection.

In some embodiments, the leakage current detection module includes a processor chip and at least one leakage current detector coil, wherein the processor chip is configured to generate the detection feedback signal in response to the leakage current detector coil detecting the leakage current.

In some embodiments, the trigger diode is a semiconductor element that is triggered to conduct when a voltage across it is above a threshold.

In a second aspect, the present invention provides an electrical power connection device, which includes a body and the leakage current detection and protection device described above, disposed inside the body.

In a third aspect, the present invention provides an electrical appliance, which includes an electrical load and an electrical power connection device coupled between a power supply and the load to supply power to the load, where the electrical power connection device includes the leakage current detection and protection device described above.

In embodiments of the present invention, the leakage current detection and protection device uses only discrete components (i.e. no IC chip) to implement the self-test module. This significantly simplifies the circuit structure and reduces manufacturing cost, while ensures safety and reliability.

BRIEF DESCRIPTION OF THE DRAWINGS

Preferred embodiments of the present invention are described with reference to the drawings. These drawings explain the embodiments and their operating principle, and only illustrate structures that are necessary to the understanding of the invention. These drawings are not to scale. In the drawings, like features are designated by like reference symbols. In the block diagrams, lines between blocks represent electrical or magnetic coupling of the blocks; the absence of lines between blocks does not mean the lack of coupling.

DETAILED DESCRIPTION OF PREFERRED EMBODIMENTS

Preferred embodiments of the present invention are described below with reference to the drawings. These drawings and descriptions explain embodiments of the invention but do not limit the invention. The described embodiments are not all possible embodiments of the present invention. Other embodiments are possible without departing from the spirit and scope of the invention, and the structure and/or logic of the illustrated embodiments may be modified. Thus, it is intended that the scope of the invention is defined by the appended claims.

Before describing the embodiments, some terms used in this disclosure are defined here to help the reader better understand this disclosure. In this disclosure, a transistor may be of any type and structure, such as field-effect transistor (FET) including metal-oxide-semiconductor field-effect transistor (MOSFET), bipolar junction transistor (BJT), silicon controlled rectifier (SCR), etc. When the transistor is a FET, the control electrode refers to the gate of the FET, the first electrode may be the drain or source of the FET, and the corresponding second electrode may be the source or drain of the FET. When the transistor is a BJT, the control electrode refers to the base of the BJT, the first electrode may be the collector or emitter of the BJT, and the corresponding second electrode may be the emitter or collector of the BJT. When the transistor is an SCR, the control electrode refers to the control electrode G of the SCR, the first electrode may be the anode, and the corresponding second electrode may be the cathode. A simulated leakage current signal is a periodic signal generated by the self-test module. Because it has a relatively short duration, although the leakage current detection module can detect the simulated leakage current signal, it will not cause the device to trip and interrupt the power connection.

Embodiments of the present invention provide a leakage current detection and protection device, where the self-test module is implemented using only discrete components to perform the self-test function. Thus, the device has a simpler structure and lower cost.

Figure 1:
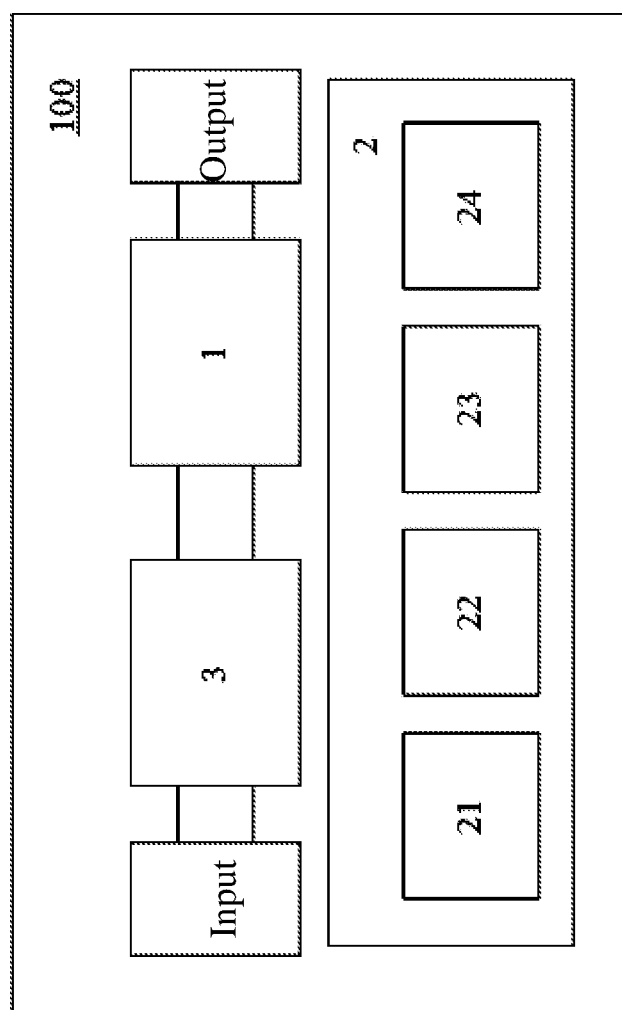
FIG. 1 is a schematic block diagram illustrating a leakage current detection and protection device according to embodiments of the present invention.

FIG. 1 is a schematic block diagram of a leakage current detection and protection device according to embodiments of the present invention.

As shown in FIG. 1, the leakage current detection and protection device 100 includes a leakage current detection module 1, a self-test module 2 and a trip module 3. The leakage current detection module 1 is coupled between the input and output ends of the power supply lines, and configured to detect any leakage current present on the power supply lines. The self-test module 2 is coupled to the power supply lines and the leakage current detection module 1, configured to periodically generate a simulated leakage current signal, which is used to test whether the leakage current detection module 1 is faulty. The self-test module 2 includes a simulated leakage current trigger circuit 21, a simulated leakage current generating circuit 22, a trigger signal turn-off module 23, and a fault signal generating module 24.

The simulated leakage current trigger circuit 21 is configured to periodically generate a simulated leakage current trigger signal. The simulated leakage current generating circuit 22 is coupled to the simulated leakage current trigger circuit 21, configured to receive the simulated leakage current trigger signal, and to generate a simulated leakage current signal in response to the simulated leakage current trigger signal. The simulated leakage current signal simulates a leakage current signal on the power supply lines. Thus, when the simulated leakage current generating circuit 22 generates the simulated leakage current signal, the leakage current detection module 1 detects the simulated leakage current signal and generates a detection feedback signal. The detection feedback signal is provided to the trigger signal turn-off module 23, which turns off the simulated leakage current trigger signal in response to the detection feedback signal. As a result, the simulated leakage current signal is turned off.

The fault signal generating module 24 is coupled to the simulated leakage current trigger circuit 21, and configured to monitor whether the simulated leakage current trigger signal is turned off or not. If the leakage current detection module 1 is faulty, and as a result the simulated leakage current trigger signal cannot be turned off, the fault signal generating module 24 generates a self-test fault signal and provides it to the trip module 3. The trip module 3 is coupled on the power supply lines between the input and output ends, and is configured to disconnect the power supply to the output end in response to the self-test fault signal.

Figure 2:
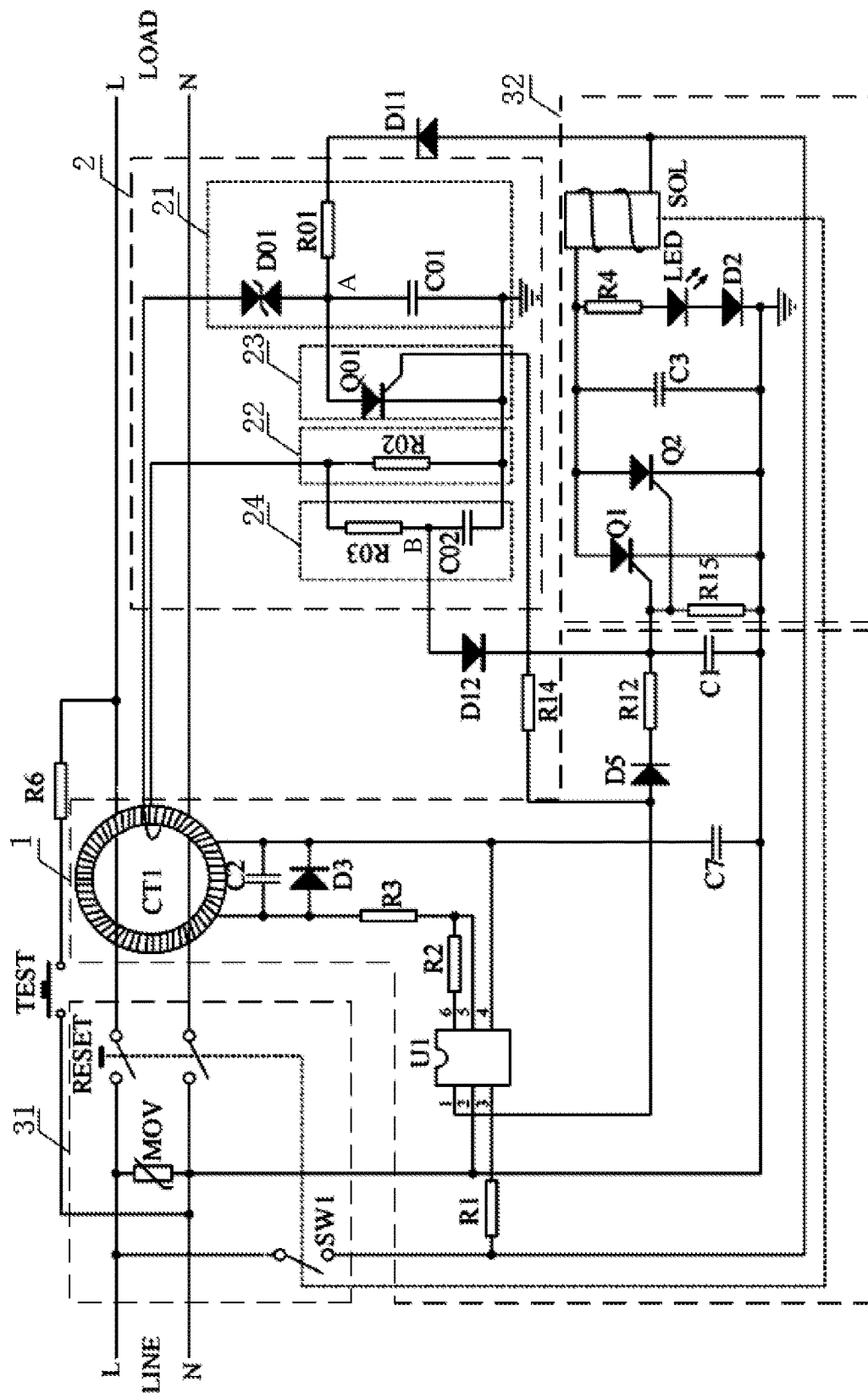
FIG. 2 is an exemplary circuit diagram illustrating a leakage current detection and protection device according to a first embodiment of the present invention.

FIG. 2 is an exemplary circuit diagram illustrating a leakage current detection and protection device according to a first embodiment of the present invention.

As shown in FIG. 2, the leakage current detection and protection device 200 is coupled on the power supply lines between the input end LINE and the output end LOAD, and includes a reset switch RESET configured to connect and disconnect the output end LOAD from the input end LINE. The leakage current detection module 1 includes a leakage current detector coil CT1, through which the power supply lines pass, and a processor chip U1. The trip module includes a switch module 31 and a drive module 32. The switch module 31 includes a switch SW1 and the reset switch RESET which is coupled on the power supply lines between LINE and LOAD. The drive module 32 includes a switch driving element (such as a solenoid SOL) and two transistors Q1, Q2.

When the leakage current detection and protection device functions normally to detect leakage current, the switch SW1 and reset switch RESET are both closed. When the current on the hot line L and neutral line N are balanced, the leakage current detector coil CT1 does not detect a current imbalance. When the current on the hot line L and neutral line N are imbalanced, i.e., there is a leakage current signal, the leakage current detector coil CT1 generates a corresponding voltage signal. The leakage current detector coil CT1 is coupled to pins 4, 5 and 6 of the processor U1. When the voltage signal from the leakage current detector coil CT1 is above a threshold, pin 1 of the processor U1 outputs a high voltage level; otherwise it outputs a low voltage level. The high voltage level on pin 1 of the processor U1 is provided to the two transistors Q1 and Q2, causing them to become conductive. Consequently, a current flows through the solenoid SOL to generate a magnetic field, which causes switches SW1 and RESET to be open, thereby disconnecting the power to the output end LOAD.

Still referring to FIG. 1, the self-test module 2 includes the simulated leakage current trigger circuit 21, the simulated leakage current generating circuit 22, the trigger signal turn-off module 23, and the fault signal generating module 24. In the embodiment of FIG. 1, the simulated leakage current trigger circuit 21 includes a trigger diode D01 and a delay module. When the trigger diode D01 is conductive, a simulated leakage current trigger signal is generated. The trigger diode D01 may be, for example, a transient-voltage-suppression diode; more generally, the trigger diode may be any semiconductor element that is triggered to conduct when a voltage across it is above a threshold. The delay module controls the conduction of the trigger diode D01, thereby controlling the time interval of the generation of the simulated leakage current trigger signal. In this embodiment, the delay module includes serial connected first resistor R01 and first capacitor C01 connected between the hot line L and the ground. By setting the resistance of the first resistor R01 and the capacitance of the first capacitor C01, the time interval of the generation of the simulated leakage current trigger signal can be set. The point A between the first resistor R01 and first capacitor C01 is coupled to the trigger diode D01.

The simulated leakage current generating circuit 22 includes a second resistor R02 coupled to the trigger diode D01. When the voltage of the upper plate of the first capacitor C01 (i.e. at point A) reaches the threshold trigger voltage of the trigger diode D01, the trigger diode D01 becomes conductive, and a simulated leakage current signal is generated through the second resistor R02 and flows through the leakage current detector coil CT1. It should be understood that the simulated leakage current signal is generated by the self-test module 2 affirmatively, and functions to simulate the leakage current signal that is present when the power supply lines have a leak.

The leakage current detection module 1 detects the simulated leakage current signal and generates a feedback signal. More specifically, the leakage current detector coil CT1 detects the simulated leakage current signal generated by the simulated leakage current generating circuit 22, and generates a corresponding voltage signal. When the voltage signal output by the leakage current detector coil CT1 is greater than a threshold, pin 1 of the processor U1 outputs a high voltage level, i.e., the detection feedback signal. The detection feedback signal is provided to the trigger signal turn-off module 23.

The trigger signal turn-off module 23 includes a first semiconductor device. In this embodiment, the first semiconductor device is implemented by a transistor Q01. The high voltage level on pin 1 of the processor U1 causes transistor Q01 to become conductive, which provides a discharge path for the first capacitor C01 to turn off the simulated leakage current trigger signal. In other words, the discharge of the first capacitor C01 causes the voltage at its upper plate to drop below the trigger voltage of the trigger diode D01, so that the trigger diode D01 is turned off. Consequently, no simulated leakage current signal is generated via the second resistor R02.

The fault signal generating module 24 includes serial connected third resistor R03 and second capacitor C02. If the leakage current detection module 1 is faulty and cannot generate the detection feedback signal to turn off the simulated leakage current trigger signal, the second capacitor C02 generates a self-test fault signal. More specifically, the serial connected third resistor R03 and second capacitor C02 are coupled in parallel with the second resistor R02. The point B between the third resistor R03 and the second capacitor C02 is coupled, via diode D12, to the transistors Q1 and Q2 of the drive module 32. As described earlier, the simulated leakage current trigger signal triggers the generation of the simulated leakage current signal. Meanwhile, a current flows through the third resistor R03, and this current continuously charges the second capacitor C02. When the leakage current detection module 1 is not faulty, it can generate a detection feedback signal when the simulated leakage current is detected, which in turn turns off the simulated leakage current trigger signal and simulated leakage current signal. Because the simulated leakage current signal lasts only a short time period, the voltage at the upper plate of the second capacitor (i.e. point B) is insufficient to drive the transistors Q1 and Q2. On the other hand, when the leakage current detection module 1 is faulty, it cannot generate a detection feedback signal, and therefore cannot turn off the simulated leakage current trigger signal. As a result, the trigger diode D01 stays conductive for a relatively long time period, and the simulated leakage current continues to flow. With the second capacitor C02 continues to be charged, the voltage at its upper plate continues to rise.

When the voltage at the upper plate of the second capacitor C02 reaches a predetermined threshold, it drives transistor Q1 and/or Q2 to become conductive. Consequently, a current flows through the solenoid SOL and generates a magnetic field to open switches SW1 and RESET, thereby disconnecting power to the output end.

The fault conditions that may occur in the leakage current detection module 1 include, without limitation: the electrical components in the leakage current detection module 1 (e.g., leakage current detector coil CT1, resistor R1, etc.) becomes open circuit or short circuit; the processor U1 is damaged; etc. In these conditions, the processor U1 cannot output a high voltage signal.

The operation of the self-test module 2 is described below.

When the leakage current detection module 1 functions normally: A current (from the hot line L via switch SW1 and diode D11) flows through the first resistor R01 to charge the first capacitor C01. After a predefined time period, the upper plate of the first capacitor C01 reaches the trigger voltage of the trigger diode D01, triggering the trigger diode D01 to conduct. Thus, a current path (with a conductor line passing through the leakage current detector coil CT1) is formed via the trigger diode D01 and the second resistor R2 to generate a simulated leakage current signal. The leakage current detector coil CT1 detects the simulated leakage current, and outputs a corresponding voltage to the processor U1, causing the processor U1 to generate a high voltage level at its pin 1 (detection feedback signal). This high voltage level causes transistor Q01 to be conductive, which provides a discharge path for the first capacitor C01. The first capacitor C01 discharges through transistor Q01, so that the voltage at the upper plate of the first capacitor C01 drops to below the trigger voltage of the trigger diode D01. Consequently, the trigger diode D01 is cut off and no current flows through it, so that no current path is formed for a simulated leakage current. The above process completes one self-test period. When the next period starts, the first capacitor C01 is charged until its upper plate reaches the trigger voltage of the trigger diode D01, and the above process is repeated.

When the leakage current detection module 1 is faulty: When, for example, the leakage current detector coil CT1 has an open circuit, or the resistor R1 has an open circuit, or the processor chip U1 is damaged, etc., causing the leakage current detection module 1 to lose its leakage current detection and protection ability, the pin 1 of the processor U1 continuous to output a low voltage level (i.e. no detection feedback signal), and the first transistor Q01 cannot become conductive. Because the first transistor Q01 is in an off state, it cannot provide a discharge path for the first capacitor C01, so the voltage at the upper plate of the first transistor Q01 causes the trigger diode D01 to be in a continuously conductive state. In this situation, the simulated leakage current continues to flow through the second resistor R02. The current that flows through the third resistor R03 continuously charge the second capacitor C02, causing the voltage at the upper plate of the second capacitor C02 to rise continuously. When the voltage at the upper plate of the second capacitor C02 reaches a predetermined value, it drives transistor Q1 and/or Q2 to be conductive. The current through the transistor Q1 and/or Q2 causes a large current in the solenoid SOL, which generates a magnetic field to open switches SW1 and RESET. This disconnects the power to the output end, protecting the load.

In summary, this embodiment uses only discrete components (i.e. no IC chip) to implement the self-test module of the leakage current detection and protection device. This significantly simplifies the circuit structure and reduces manufacturing cost, while ensures safety and reliability.

Figure 3:
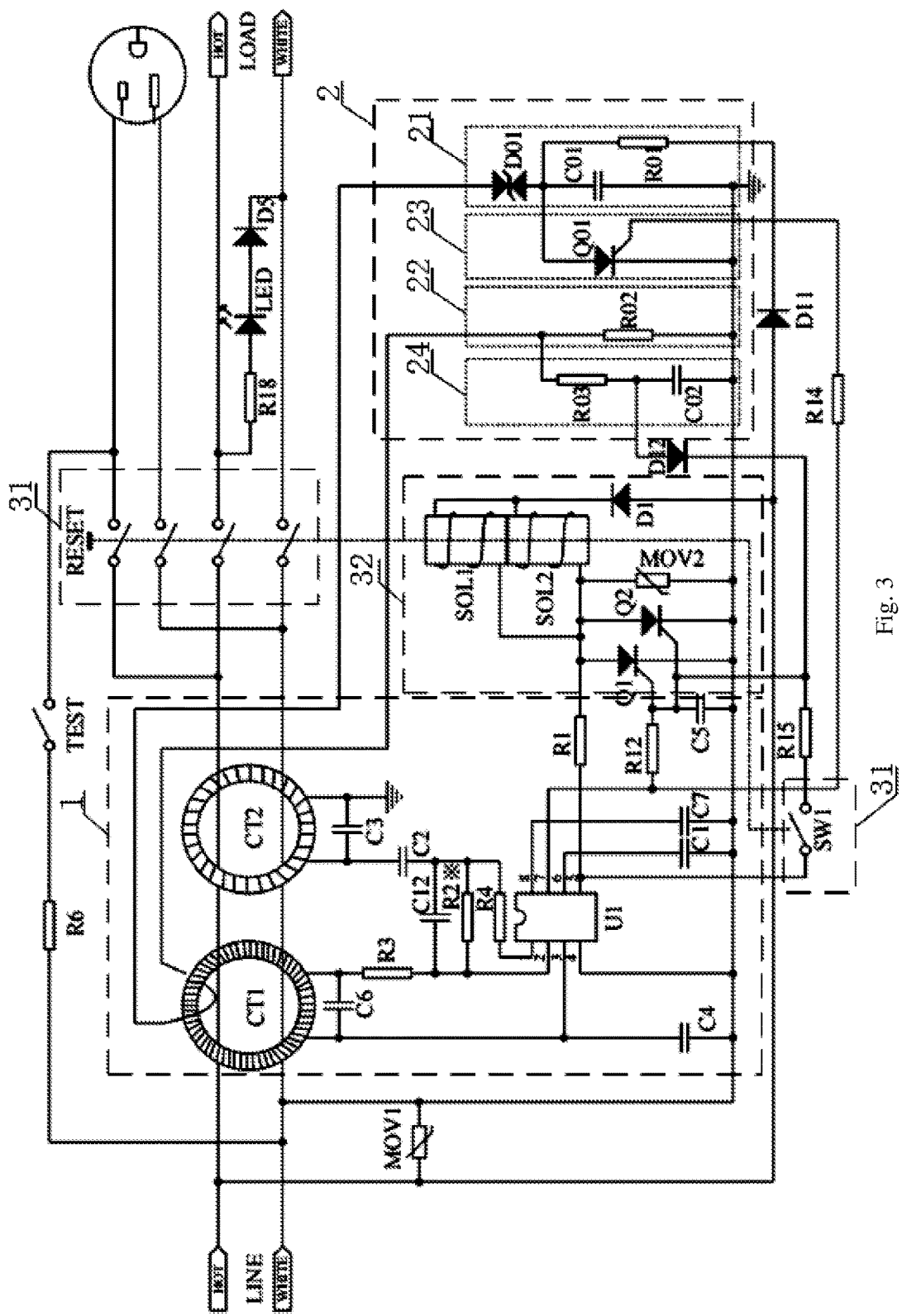
FIG. 3 is an exemplary circuit diagram illustrating a leakage current detection and protection device according to a second embodiment of the present invention.

FIG. 3 is an exemplary circuit diagram illustrating a leakage current detection and protection device according to a second embodiment of the present invention.

One difference between the embodiment of FIG. 3 and the embodiment of FIG. 2 is that, the leakage current detection module 1 of the leakage current detection and protection device 300 in FIG. 3 employs two leakage current detector coils CT1 and CT2, to improve leakage current protection for the neutral line WHITE. Also, two reset switches RESET are provided to connect or disconnect power to the electrical load LOAD and an output power receptacle, respectively. Further, the drive module 32 employs two solenoids SOL1 and SOL2, to provide redundancy in case one of the solenoids becomes defective. The self-test module 2 of the leakage current detection and protection device 300 is the same as that in the embodiment of FIG. 2, and further descriptions are omitted.

Figure 4:
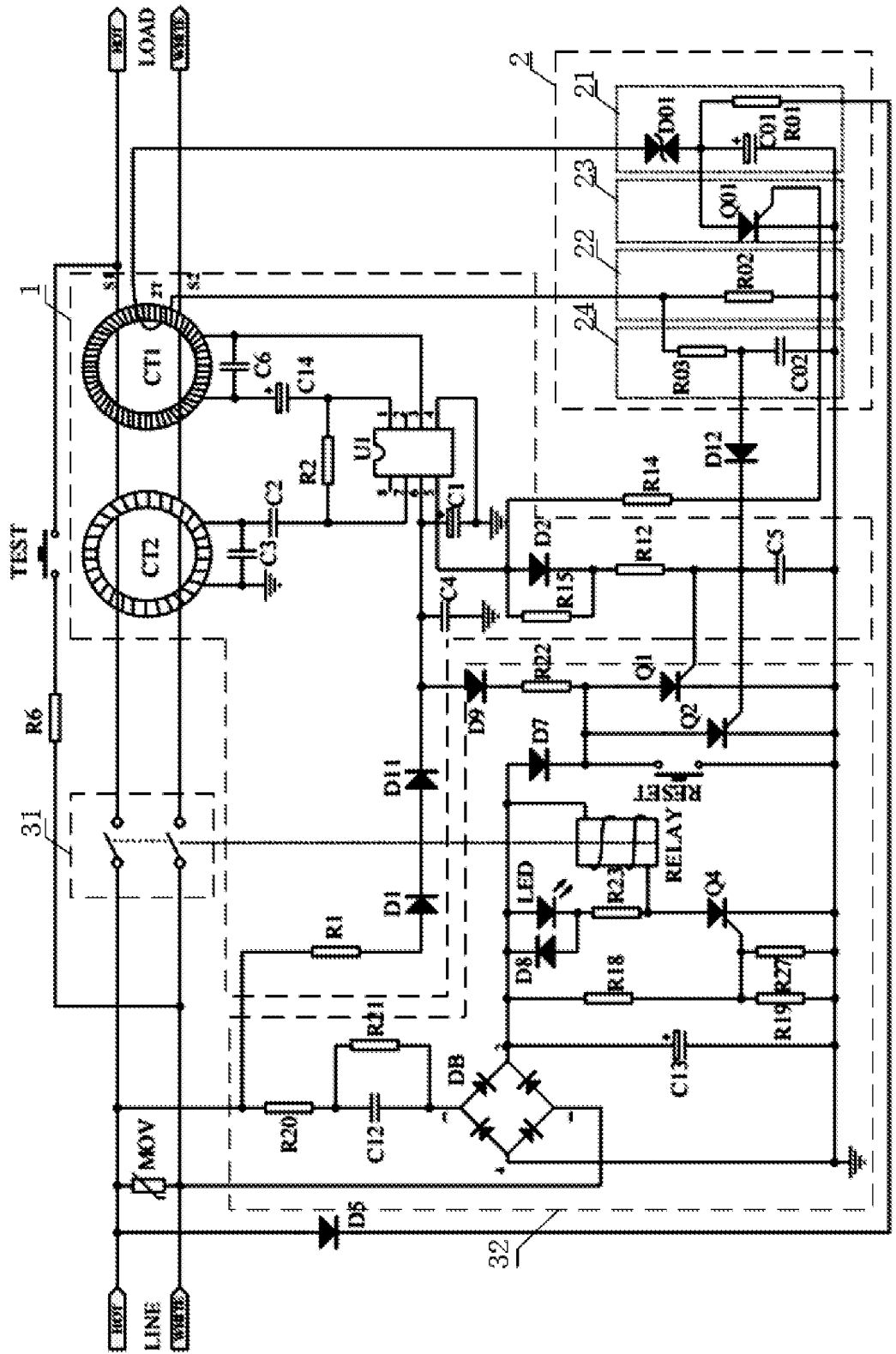
FIG. 4 is an exemplary circuit diagram illustrating a leakage current detection and protection device according to a third embodiment of the present invention.

FIG. 4 is an exemplary circuit diagram illustrating a leakage current detection and protection device according to a third embodiment of the present invention.

One difference between the embodiment of FIG. 4 and the embodiment of FIG. 2 is that, the leakage current detection module 1 of the leakage current detection and protection device 400 in FIG. 4 employs two leakage current detector coils CT1 and CT2, where CT2 is mainly used to provide leakage current protection for the neutral line WHITE. Further, the drive module 32 in FIG. 4 employs a relay RELAY to replace the solenoid SOL of FIG. 2 to control the open and close of the switch module 31. In normal working conditions, a current flows through the relay to close the switches in the switch module 31. When the leakage current detection module 1 detects a leakage current, the pin 5 of the processor U1 outputs a high voltage level, which drives the transistors Q1 and/or Q2 to be conductive. As a result, the voltage at the upper end of the relay drops, turning off the current in the relay, which in turn opens the switches in the switch module 31. The self-test module 2 of the leakage current detection and protection device 400 is the same as that in the embodiment of FIG. 2, and further descriptions are omitted.

Figure 5:
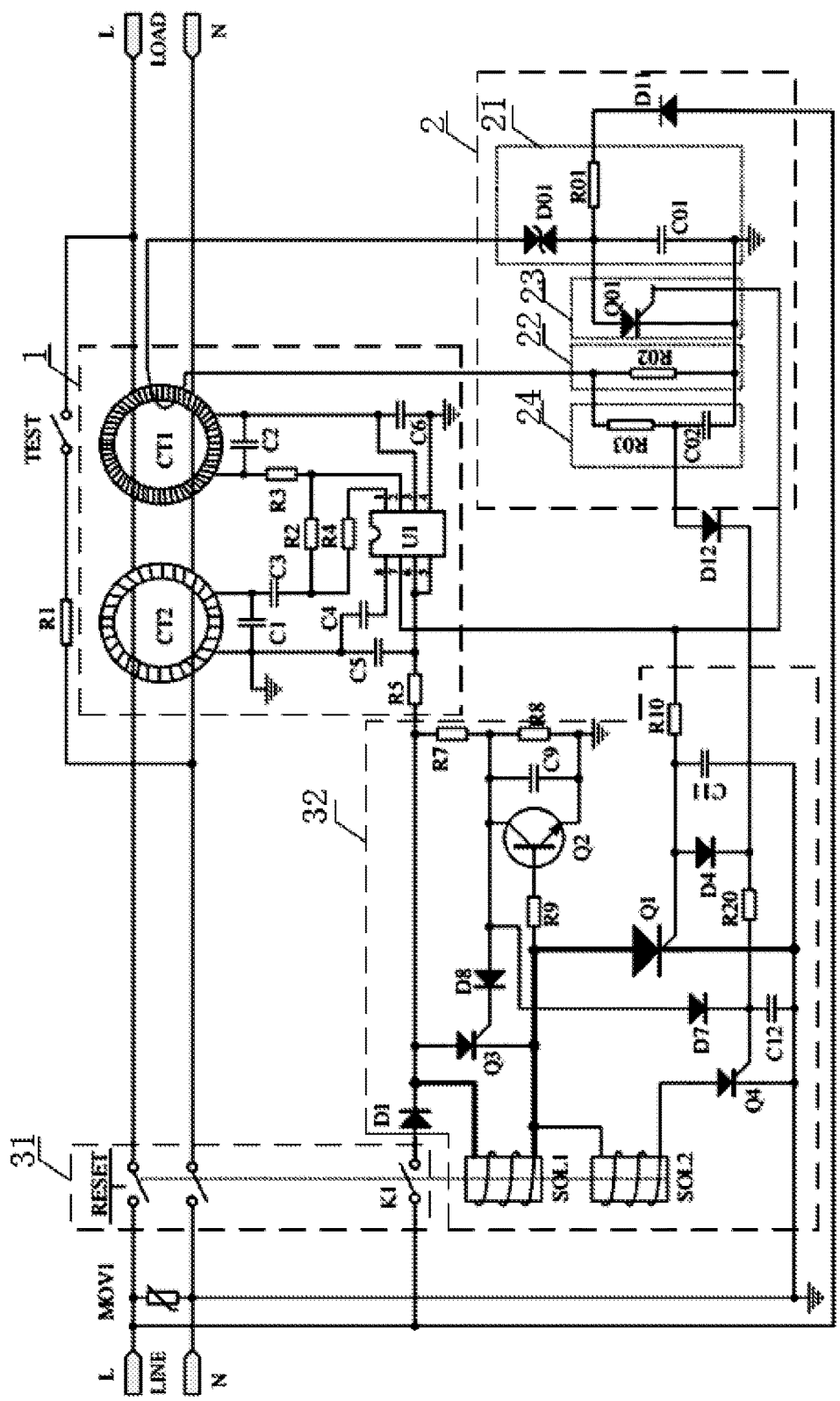
FIG. 5 is an exemplary circuit diagram illustrating a leakage current detection and protection device according to a fourth embodiment of the present invention.

FIG. 5 is an exemplary circuit diagram illustrating a leakage current detection and protection device according to a fourth embodiment of the present invention.

One difference between the embodiment of FIG. 5 and the embodiment of FIG. 2 is that, the leakage current detection module 1 of the leakage current detection and protection device 500 in FIG. 5 employs two leakage current detector coils CT1 and CT2, where CT2 is mainly used to provide leakage current protection for the neutral line WHITE. Further, the drive module 32 employs two solenoids SOL1 and SOL2, to provide redundancy in case one of the solenoids becomes defective. The self-test module 2 of the leakage current detection and protection device 500 is the same as that in the embodiment of FIG. 2, and further descriptions are omitted.

Figure 6:
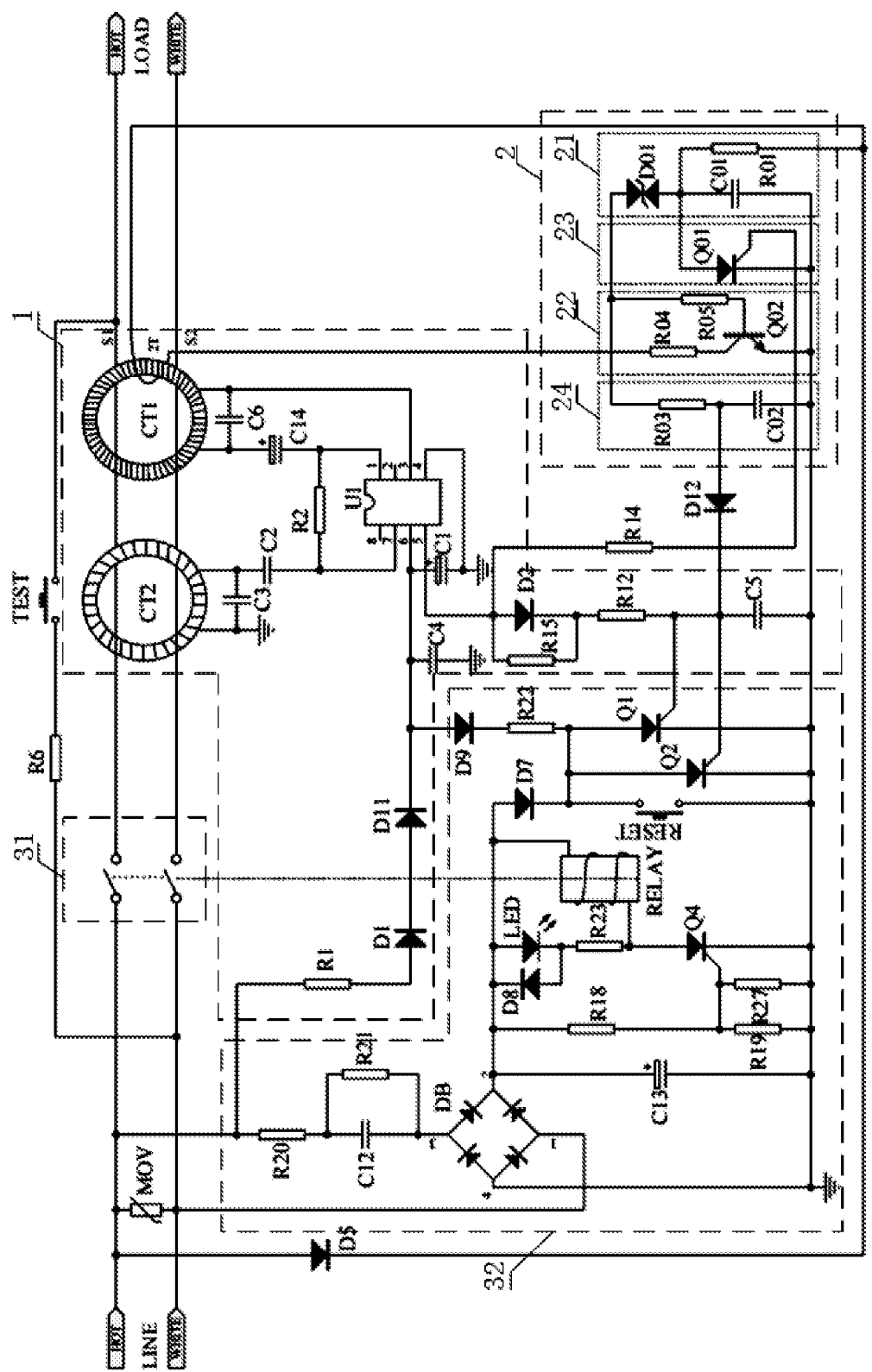
FIG. 6 is an exemplary circuit diagram illustrating a leakage current detection and protection device according to a fifth embodiment of the present invention.

FIG. 6 is an exemplary circuit diagram illustrating a leakage current detection and protection device according to a fifth embodiment of the present invention.

In the leakage current detection and protection device 600 of FIG. 6, the leakage current detection module 1, switch module 31 and drive module 32 are the same as those components in the embodiment of FIG. 4, and further descriptions are omitted. A main difference between the self-test module 2 of FIG. 6 and that of FIG. 2 is in the simulated leakage current generating circuit 22, while the simulated leakage current trigger circuit 21, the trigger signal turn-off module 23 and the fault signal generating module 24 in FIG. 6 are the same as those in the embodiment of FIG. 2. As shown in FIG. 6, the simulated leakage current generating circuit 22 includes a second semiconductor device, a fourth resistor R04 and a fifth resistor R05. In this embodiment, the second semiconductor device is implemented by a transistor Q02. The first electrode of the second transistor Q02 is coupled to the fourth resistor R04, and its control electrode is coupled to the trigger diode D01 via the fifth resistor R05. When the trigger diode D01 becomes conductive, the second transistor Q02 becomes conductive too, so as to generate a simulated leakage current signal via the fourth resistor R04. Further, the third resistor R03 of the fault signal generating module 24 is coupled to the fifth resistor R05 and the trigger diode D01, and charges the second capacitor C02 using the current through the trigger diode D01.

The operation of the self-test module 2 of FIG. 6 is described below.

When the leakage current detection module 1 functions normally: A current flows through the first resistor R01 an charges first capacitor C01. After a predefined time period, the upper plate of the first capacitor reaches the trigger voltage of the trigger diode D01, triggering the trigger diode D01 to conduct. This causes the second transistor Q02 to also become conductive, forming a current path to generate a simulated leakage current signal via the fourth resistor R04. The leakage current detector coil CT1 detects the simulated leakage current, and outputs a corresponding voltage to the processor U1, causing the processor U1 to generate a high voltage level at its pin 5 (detection feedback signal). This high voltage level causes transistor Q01 to be conductive, which provides a discharge path for the first capacitor C01. The first capacitor C01 discharges via transistor Q01, so that the voltage at the upper plate of the first capacitor C01 drops to below the trigger voltage of the trigger diode D01. Consequently, the trigger diode D01 is cut off, causing transistor Q01 to also be cut off, so that no current path is formed for a simulated leakage current. The above process completes one self-test period. When the next period starts, the first capacitor C01 is charged until its upper plate reaches the trigger voltage of the trigger diode D01, and the above process is repeated.

When the leakage current detection module 1 is faulty: When, for example, the leakage current detector coil CT1 has an open circuit, or the processor chip U1 is damaged, etc., causing the leakage current detection module 1 to lose its leakage current detection and protection ability, the pin 5 of the processor U1 continuous to output a low voltage level, so the first transistor Q01 cannot become conductive. Because the first transistor Q01 is in an off state, it cannot provide a discharge path for the first capacitor C01, so the voltage at the upper plate of the first transistor Q01 causes the trigger diode D01 to be in a continuously conductive state. In this situation, the current that flows through the third resistor R03 continuously charge the second capacitor C02, causing the voltage at the upper plate of the second capacitor C02 to rise continuously. When the voltage at the upper plate of the second capacitor C02 reaches a predetermined value, it drives transistor Q1 and/or Q2 to be conductive. The current through the transistor Q1 and/or Q2 causes the voltage at the upper end of the relay RELAY to drop, which turns off the current in the relay, which in turn opens the switches in the switch module 31. This disconnects the power to the output end, protecting the load.

Figure 7:
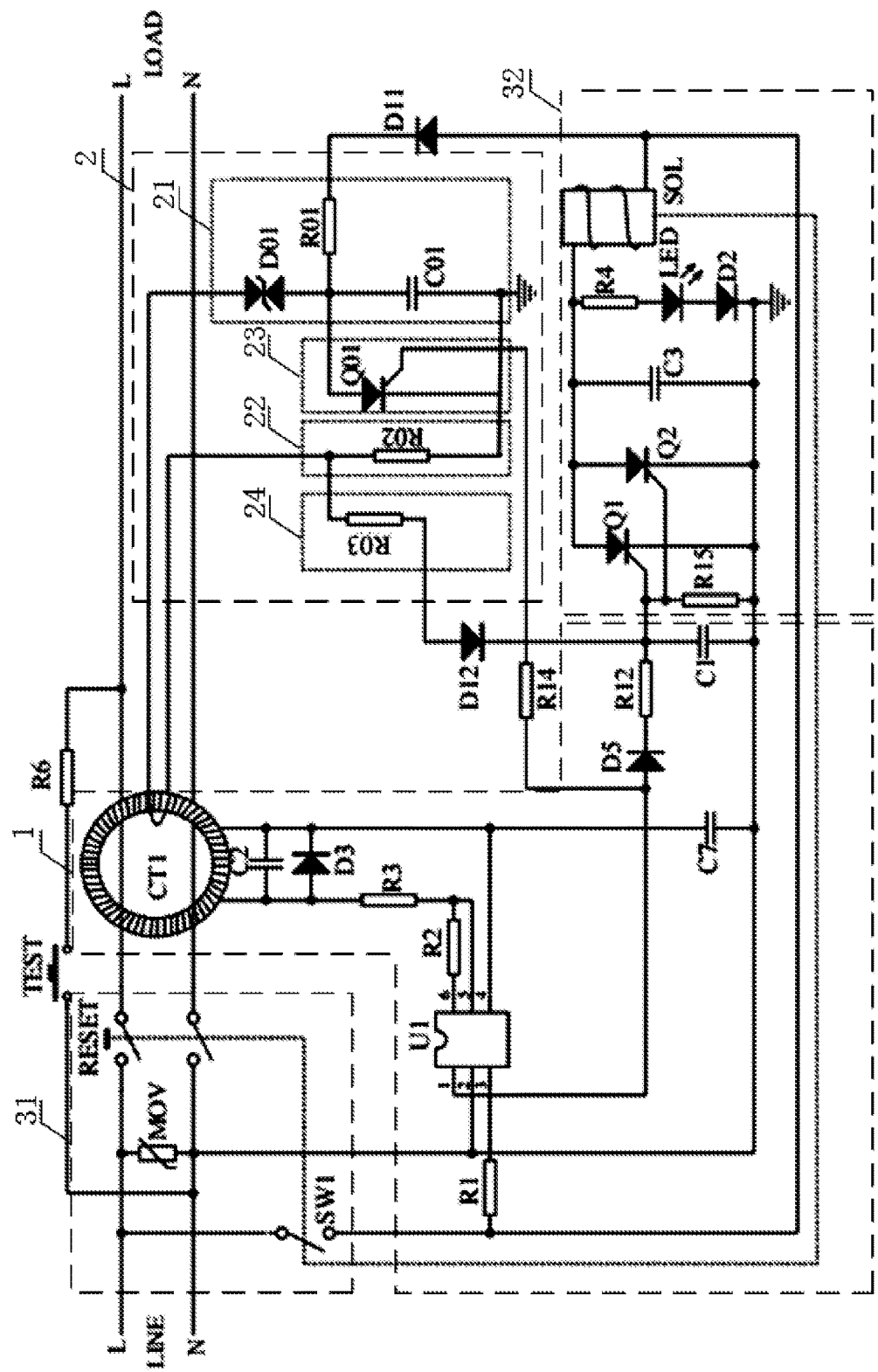
FIG. 7 is an exemplary circuit diagram illustrating a leakage current detection and protection device according to a sixth embodiment of the present invention.

FIG. 7 is an exemplary circuit diagram illustrating a leakage current detection and protection device according to a sixth embodiment of the present invention.

In the leakage current detection and protection device 700 of FIG. 7, the leakage current detection module 1, switch module 31 and drive module 32 are the same as those components in the embodiment of FIG. 2, and further descriptions are omitted. A main difference between the self-test module 2 of FIG. 7 and that of FIG. 2 is in the fault signal generating module 24, while the simulated leakage current trigger circuit 21, the simulated leakage current generating circuit 22, and the trigger signal turn-off module 23 in FIG. 7 are the same as those in the embodiment of FIG. 2. As shown in FIG. 7, the fault signal generating module 24 only includes a third resistor R03. In lieu of the second capacitor C02 in FIG. 2, in this embodiment, the third resistor R03 is used in cooperation with a fourth capacitor C1 of the leakage current detection module 1. In other words, when the leakage current detection module 1 is faulty and cannot turn off the simulated leakage current trigger signal and the simulated leakage current signal, the third resistor R03 will continue to charge the fourth capacitor C1, so the voltage at the upper plate of the fourth capacitor C1 rise continuously. When it reaches a predetermined value, the voltage drives transistor Q1 and/or transistor Q2 to become conductive, and the solenoid SOL opens the switches SW1 and RESET. This structure further reduces the number of components in the self-test module, further reducing cost.

In the above embodiments, by using only discrete components to implement the self-test module of the leakage current detection and protection device, the circuit structure is significantly simplified the and manufacturing cost reduced, while safety and reliability are ensured.

While the above embodiments use transistors as examples, it should be understood that the transistors may be replaced by other types of semiconductor devices, such as photoelectric coupling elements, or any switching elements that respond to a control voltage.

Some additional embodiments of the present invention provide an electrical power connection device, which includes a body and a leakage current detection and protection device according to any one of the above embodiments disposed inside the body.

Other additional embodiments of the present invention provide an electrical appliance, which includes an electrical load and an electrical power connection device coupled between a power supply and the load to supply power to the load, where the electrical power connection device employs a leakage current detection and protection device according to any one of the above embodiments.

While the present invention is described above using specific examples, these examples are only illustrative and do not limit the scope of the invention. It will be apparent to those skilled in the art that various modifications, additions and deletions can be made to the leakage current detection and protection device of the present invention without departing from the spirit or scope of the invention.

What is claimed is:

1. An leakage current detection and protection device for power supply lines, comprising:
   a leakage current detection module, configured to detect a leakage current present on the power supply lines and to generate a detection feedback signal in response to detecting the leakage current;

a self-test module, configured to test whether the leakage current detection module is faulty, the self-test module including:
- a simulated leakage current trigger circuit, configured to generate a simulated leakage current trigger signal;
- a simulated leakage current generating circuit, configured to generate a simulated leakage current signal in response to the simulated leakage current trigger signal, wherein the simulated leakage current signal simulates a leakage current signal on the power supply lines;
- a trigger signal turn-off module, configured to turn off the simulated leakage current trigger signal in response to the detection feedback signal; and
- a fault signal generating module, coupled to the simulated leakage current trigger circuit, and configured to detect a fault in the leakage current detection module and to generate a self-test fault signal in response to detecting the fault; and a trip module, coupled on the power supply lines and configured to disconnect the power supply lines in response to the self-test fault signal.

2. The leakage current detection and protection device of claim 1, wherein the simulated leakage current trigger circuit, the simulated leakage current generating circuit, the trigger signal turn-off module and the fault signal generating module include only discrete components.

3. The leakage current detection and protection device of claim 1, wherein the simulated leakage current trigger circuit includes a trigger diode, configured to generate the simulated leakage current trigger signal when conductive; and
a delay module, coupled to the trigger diode and configured to control the conductivity of the trigger diode, wherein the delay module controls a time interval of the generation of the simulated leakage current trigger signal.

4. The leakage current detection and protection device of claim 3, wherein the delay module includes serial connected first resistor and first capacitor, and the trigger signal turn-off module includes a first semiconductor device, wherein the first semiconductor device is configured to become conductive in response to the detection feedback signal to provide a discharge path for the first capacitor to turn off the simulated leakage current trigger signal.

5. The leakage current detection and protection device of claim 4, wherein the first semiconductor device is a silicon controlled rectifier (SCR), or a bipolar junction transistor (BJT), or a field-effect transistor (FET), or a photoelectric coupling element.

6. The leakage current detection and protection device of claim 3, wherein the simulated leakage current generating circuit includes a second resistor coupled to the trigger diode, configured to form a current path for the simulated leakage current when the trigger diode is conductive.

7. The leakage current detection and protection device of claim 3, wherein the simulated leakage current generating circuit includes a second semiconductor device, a fourth resistor and a fifth resistor, wherein a first electrode of the second semiconductor device is coupled to the fourth resistor, and a control electrode of the second semiconductor device is coupled to the trigger diode via the fifth resistor, and wherein when the trigger diode becomes conductive, the second semiconductor device becomes conductive in response thereto to form a current path for the simulated leakage current signal via the fourth resistor.

8. The leakage current detection and protection device of claim 7, wherein the second semiconductor device is a silicon controlled rectifier (SCR), or a bipolar junction transistor (BJT), or a field-effect transistor (FET), or a photoelectric coupling element.

9. The leakage current detection and protection device of claim 1, wherein the fault signal generating module includes serial connected third resistor and second capacitor, wherein in response to the simulated leakage current trigger signal, the third resistor charges the second capacitor, and wherein when the leakage current detection module is faulty and does not generate the detection feedback signal to turn off the simulated leakage current trigger signal, the fault signal generating module generates the self-test fault signal at the second capacitor.

10. The leakage current detection and protection device of claim 1, wherein the fault signal generating module includes a third resistor, and the leakage current detection module includes a fourth capacitor coupled in series with the third resistor, wherein in response to the simulated leakage current trigger signal, the third resistor charges the fourth capacitor, and wherein when the leakage current detection module is faulty and does not generate the detection feedback signal to turn off the simulated leakage current trigger signal, the fault signal generating module generates the self-test fault signal at the fourth capacitor.

11. The leakage current detection and protection device of claim 1, wherein the trip module includes:
a switch module coupled on the power supply lines between an input end and an output end, and configured to connect or disconnect an electrical connection between the input end and the output end; and
a drive module, configured to drive the switch module in response to the self-test fault signal to disconnect the electrical connection.

12. The leakage current detection and protection device of claim 1, wherein the leakage current detection module includes a processor chip and at least one leakage current detector coil, wherein the processor chip is configured to generate the detection feedback signal in response to the leakage current detector coil detecting the leakage current.

13. The leakage current detection and protection device of claim 1, wherein the trigger diode is a semiconductor element that is triggered to conduct when a voltage across it is above a threshold.

14. An electrical power connection device, comprising:
a body; and
the leakage current detection and protection device of claim 1 disposed inside the body.

15. An electrical appliance, comprising:
an electrical load; and
an electrical power connection device coupled between a power supply and the load to supply power to the load, where the electrical power connection device includes the leakage current detection and protection device of claim 1.

* * * * *